Figure 1A:
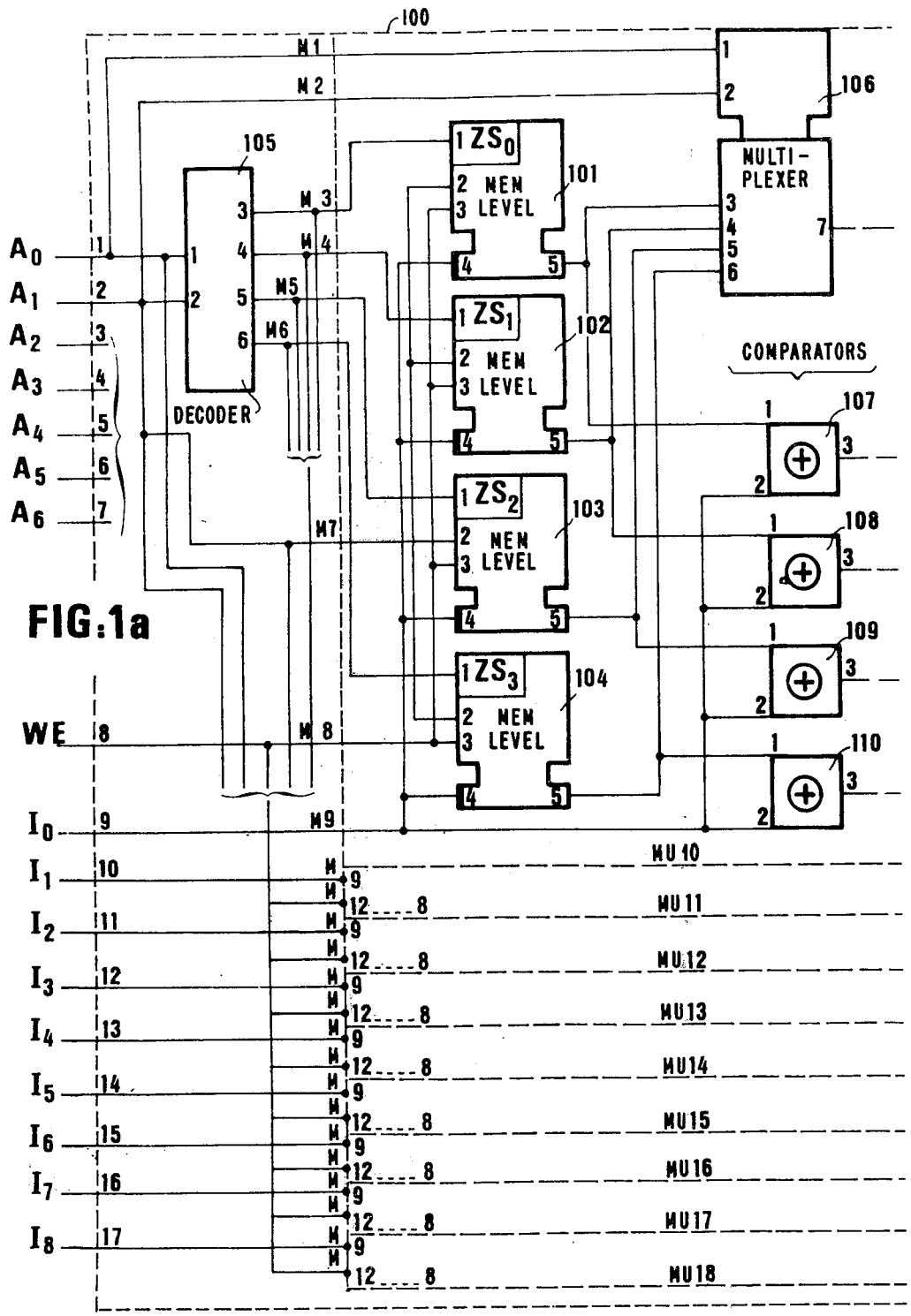

United States Patent [19]

Vinot

[11] 4,128,899
[45] Dec. 5, 1978

[54] ASSOCIATED READ/WRITE MEMORY

[75] Inventor: Daniel Vinot, Sucy-en-Brie, France

[73] Assignee: Compagnie Internationale pour l'Informatique Cii Honeywell Bull, Paris, France

[21] Appl. No.: 785,234

[22] Filed: Apr. 6, 1977

[30] Foreign Application Priority Data

Apr. 15, 1976 [FR] France .............................. 76 11233

[51] Int. Cl.² ............................................ G11C 15/00
[52] U.S. Cl. .................................................... 365/49
[58] Field of Search ................... 340/173 AM; 365/49, 365/50

[56] References Cited

U.S. PATENT DOCUMENTS

| 3,644,906 | 2/1972 | Weinberger | 340/173 AM |
| 3,685,020 | 8/1972 | Meade | 340/173 AM |
| 3,895,360 | 7/1975 | Cricchi et al. | 340/173 AM |
| 3,913,075 | 10/1975 | Vitaliev et al. | 340/173 AM |

OTHER PUBLICATIONS

Weinberger, Hybrid Associative Memory, IBM Technical Disclosure Bulletin, vol. 11, No. 12, May 1969, pp. 1744-1745.

Primary Examiner—Stuart N. Hecker
Attorney, Agent, or Firm—Cameron, Kerkam, Sutton, Stowell & Stowell

[57] ABSTRACT

A high capacity associative read/write memory is provided which includes storage means which can be read from or written into and having memory units of equal capacity each containing an equal and predetermined number of levels. Addressing means are connected to the storage means to select storage levels in each memory unit and to select the required memory location on the selected level. Associative means connected to the storage means consists of a plurality of comparators equal in number to the number of levels in each memory unit multiplied by the number of memory units. The comparators perform a comparison between the content of a data descriptor at the input to the associative memory and the content of the information read from the memory on the selected level.

5 Claims, 3 Drawing Figures

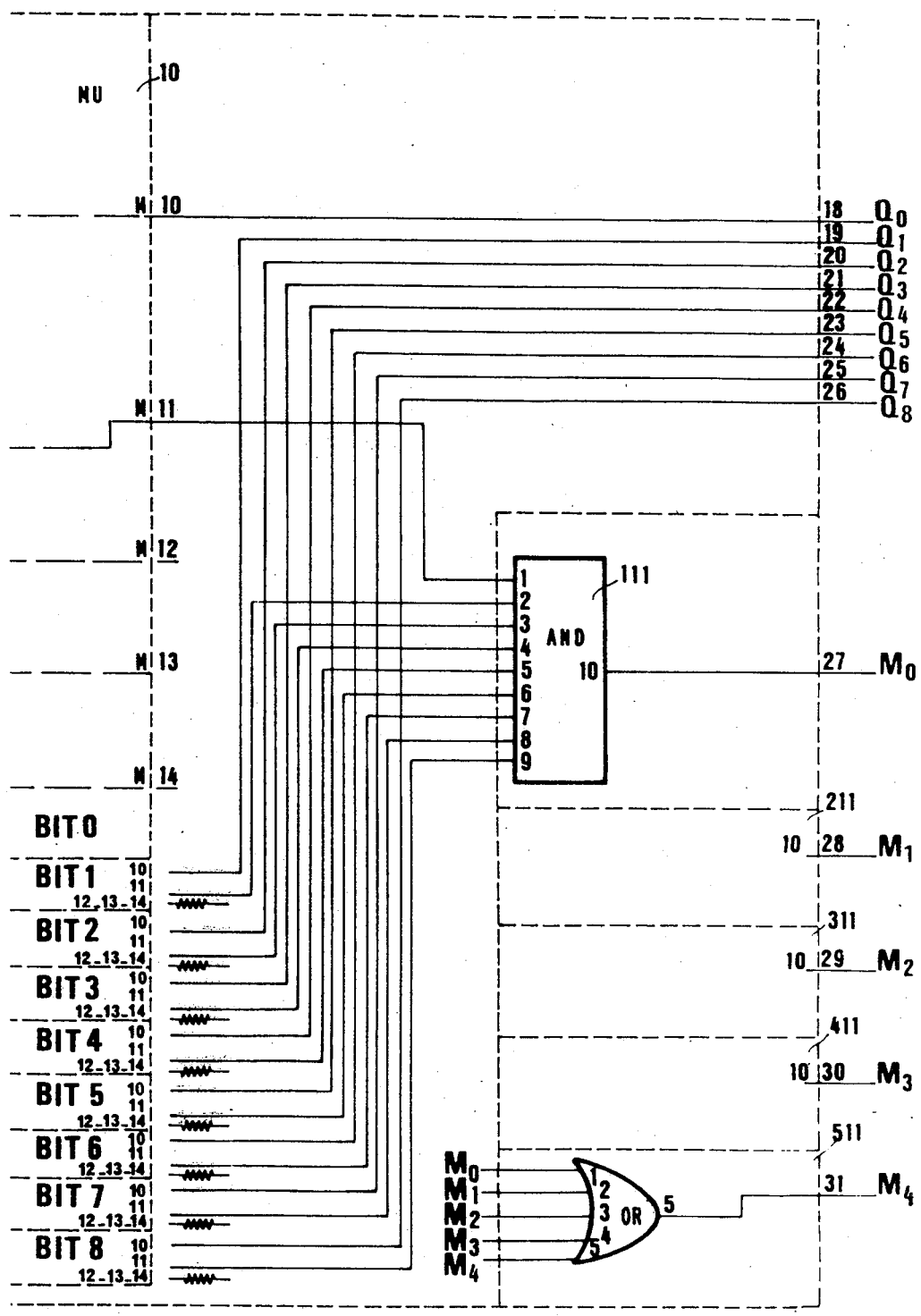
FIG: 1b

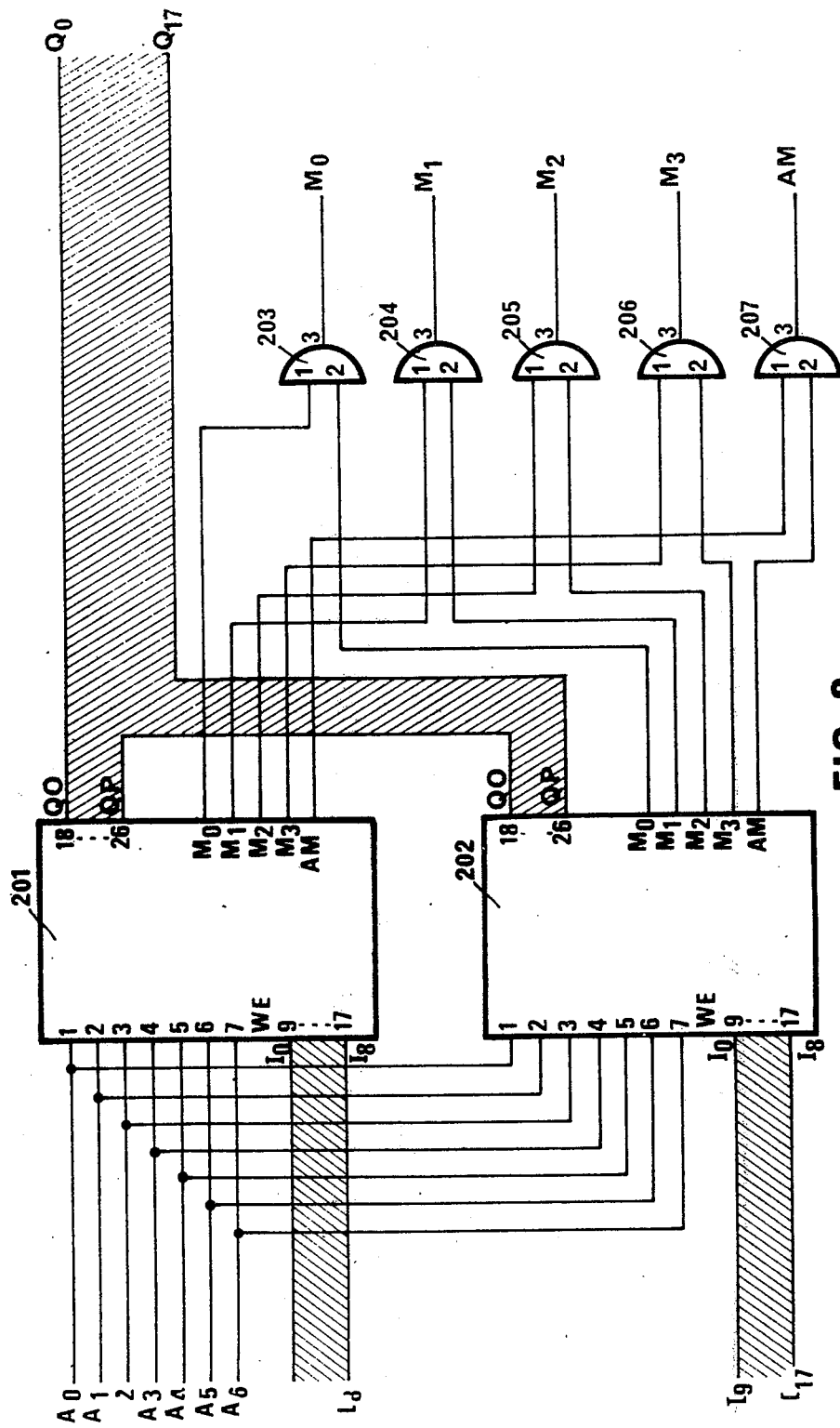
FIG: 2

ASSOCIATED READ/WRITE MEMORY

The present invention relates to a high capacity memory which can be addressed for both reading and writing and which has the characteristics of an associative memory.

Associative or content-addressed memories are used in particular in techniques for addressing the main or central memory of digital computers. They are also used for consulting tables or for certain re-coding operations. Generally, such memories are designed not to find an item of information whose store address is known but to discover whether an item of information termed a descriptor is contained in the memory and, if it is, to provide an associated item of information, the content of the descriptor word being compared with the content of the memory word with the comparison taking place bit by bit.

Two problems have been encountered in the development of associative memories, relating on the one hand to their manufacture and on the other hand to their use.

As regards manufacture, the production of the comparators restricts the capacity of the memories, since it becomes an increasingly complex matter to produce them by large scale integration (LSI) techniques as the capacity of the memory increases. Thus, in high-capacity designs of associative memory, it is necessary to have a number of LSI modules grouped together on one and the same printed circuit, thus resulting in the loss of space in which various components of a computer could be accommodated. As a consequence, such designs are expensive.

In use, the memories can be faulted for lack of versatility and in particular they cannot be used in the normal read/write modes of conventional read/write memories.

The present invention has as an object to provide a new associative memory which does not encounter the above shortcomings and whose moderate complexity enables it to be produced by LSI techniques, thus allowing manufacture at lower cost.

The memory according to the invention is made up of firstly, storage means which can be read from or written into and which consist of memory units of equal capacity each containing an equal and predetermined number of levels, of secondly, addressing means connected to the said first means which enable a storage level to be selected in each memory unit and the required memory location to be selected, on the selected level and of thirdly, associative means which are connected to the said first means and consist of comparators, equal in number to the number of levels in each memory unit multiplied by the number of memory units, which are responsible for comparing a data descriptor with information read from the various memory units on any selected level.

The invention will be better understood from the following description, which refers to the drawings.

FIGS. 1a and 1b, when placed side by side with FIG. 1a to the left of FIG. 1b, show an associative memory according to the invention.

FIG. 2 shows an example of a combination of associative memories according to the invention.

In FIG. 1a, and FIG. 1b the memory of the invention is shown inside a rectangle 100. The inputs and outputs of memory 100 are marked at the circumference of the rectangle 100 as numbers 1 to 31. The meanings of these numbers are as follows.

Inputs 1 to 7 are the terminals for connecting memory 100 to conductors which transmit the address word for the information to a read from or written into the memory. Terminals 1 and 2 receive the address bits A0 and A1 for a level. Terminals 3 to 7 receive the address bits A2 to A6 for a memory location within the level.

Terminal 8 receives a bit WE to authorise writing in the memory 100.

Terminals 9 to 17 receive data bits $I_0$ to $I_7$ and a parity bit $I_p$.

Terminals 18 to 26 transmit the data items $Q_0$ to $Q_7$ and the parity bit $Q_8$ read from the memory.

Terminals 27 to 30 transmit the result of a comparison between a data descriptor present at inputs 9 to 17 of the memory and the content of a memory location, which appears at terminals 18 to 27 after selection by the address word present at terminals 1 to 7 of memory 100.

Terminals 27 to 30 also indicate the level of the memory on which the comparison took place in cases where the contents of the memory word and the data descriptor word are identical.

Terminal 31 gives an indication when the contents of the data descriptor and of a memory word selected on any level are identical.

In the present embodiment the memory 100 contains nine memory units which are indicated by the MU10 to MU18, although this number is by no means limiting, at least in theory. The memory units 10 to 18 are all constructed in the same way and they contain memory elements which are assigned to levels, there being one memory element per level. Thus, in FIG. 1a, memory element 101 corresponds to level 0, memory element 102 corresponds to level 1, and so on. There are four levels shown, which have corresponding memory elements 101 to 104, but this number is definitely not limiting. Since memory units 10 to 18 are identical, only the constituent parts of memory unit 10 have been shown. Each memory unit such as MU 10 has data inputs and outputs which are identified by the numbers M1 to M14 at the circumference of the rectangle 10. Rectangle MU11 to MU18 have been numbered in the same way. Input M1 to M6 receive the bits for selecting a level within each memory unit. Input M7 in fact consists of five input points and it receives the five conductors which enable a memory location to be addressed within a level. It is connected on the one hand to input points 3 to 7 of memory 100 and on the other hand to the five input points marked 2 of each memory element 101 to 104. Input 8 receives the write authorisation bit and is connected to input point 8 of memory 100 and to point 3 of each memory element 101 to 104. The points 9 of the memory units 10 to 18 are connected to respective ones of the data input terminals 9 to 17 of memory 100. The outputs M10 of the memory units 10 to 18 are connected to respective ones of the output terminals 18 to 26 of memory 100. The output M11 of any of the memory units 10 to 18 takes the logic 1 level whenever the bit read from the memory element for level 0 and the data bit present at input 9 of the memory unit are identical in value. Outputs 12 and 14 perform the same function as output 11 whenever the bits read from the memory elements for levels 2 and 3 respectively and the data bit present at input 9 of each memory unit are of identical value. The comparison between these states is performed by means of comparators 107, 108, 109 and 110. Each of the comparators has two inputs and one output. The inputs 1 of the comparators 107 to 110 are connected to respective ones of the outputs 5 of the memory elements 101 to 104. Input 2 of each comparator is connected to input 0 of its memory unit. The outputs 3 of the comparators 107 to 110 are connected to respective ones of the outputs 11 to 14 of their memory units.

The selection of memory elements within the memory units 10 to 18 is effected by a decoder 105 which receives at two inputs marked 1 and 2 the level selecting bits contained in the word for the address of the information which is to be read from or written into memory 100. Since the embodiment shown contains only four levels, two level-address bits are required. To select BS 2 power VN levels levels it would of course be necessary to have n level-address bits. The inputs 1 and 2 of the decoder 105 are connected to the addressing inputs 1 and 2 of the memory 100. The outputs 3, 4, 5 and 6 of decoder 105 cause memory levels 0, 1, 2, 3 respectively to be selected within each memory unit 10 to 18.

The outputs 3, 4, 5, 6 are connected to the 1 terminals of the memory elements which respectively correspond to levels 0, 1, 2, 3, in each of the memory units.

Output M10 of each memory unit is connected to the output 7 of a multiplexer situated within the unit and this multiplexer has inputs 3, 4, 5, 6 which are connected to respective ones of the outputs 5 of the memory elements 101 to 104 within each memory unit. The multiplexing of the inputs is controlled from inputs 1 and 2 of the multiplexer, which are connected to terminals 1 and 2 of memory 100.

The associative means consist of comparators 107 to 110 in each memory unit and of 4 AND gates 111, 211, 311 and 411 (one AND gate per level). Each AND gate has 9 inputs marked 1 to 9 and an output 10 which is connected to one of the output points 27, 28, 29 and 30 of memory 100. The AND gate for level 1, which is marked 111, is connected by its output 10 to the point M0 marked 27 of memory 100. The outputs 10 of AND gates 211, 311, and 411 are connected to the points marked 28, 29 and 30 respectively of memory 100. Thus, when the descriptor at the input terminals 9 to 17 of memory 100 is equal to the content of the word selected on level 0 of memory 100, all the outputs 11 of the memory units are at the logic 1 level, as also are inputs 1 to 9 of AND gate 111, and output 27 of memory 100 emits a signal M0 at the logic 1 level.

An OR circuit 511 receives at its inputs marked 1, 2, 3, 4 the signals M0 to M3 which comes from the outputs 10 of AND gates 111 to 411. Output 5 goes to the logic 1 level when one of the signals M0, M1, M2 and M3 goes to the 1 level at the output of memory 100 and this advises modules external to memory 100 that a descriptor word and a memory word have coincided.

From the foregoing description it can readily be appreciated that the associative nature of the memory only requires a limited number of comparators. In the above example it was seen that for each memory unit organised into four levels, four comparators sufficed. For a nine-bit descriptor word it is necessary to use nine memory units and this raises the number of comparators to thirty-six. Finally, it is necessary to use four AND gates having nine inputs.

A general statement can be made that if the descriptor word is assumed to contain n bits and if there are assumed to be m memory levels, the number of comparators required will be m × n and the number of AND gates having n inputs will be m.

Finally, the number of comparators and the number of gates depends only on the number of memory levels and the length of the descriptor word. They are unaffected by the overall memory capacity, which is not the case with conventional associative memories.

FIG. 2 shows an example of a combination of associative memories according to the invention.

When the descriptor word is of variable size, and in particular when the number of bits of which it is composed is greater than the number of memory units in the associative memory, it is possible to combine a plurality of associative memories on the same printed circuit. FIG. 2 shows a combination of two associative memories 201 and 202.

The addressing terminals 1 to 7 have to be connected together, as also do the write authorising terminals. The data descriptor word is shared between the terminals 9 to 16 of both of the memories. The M0 outputs of the memories are connected to respective inputs of an AND gate 203 whilst the M1, M2 and M3 outputs are respectively connected to the corresponding inputs of AND gates 204 to 206. The signal M0 from AND gate 203 assumes the logic 1 value when the signal M0 supplied by memory 201 and the signal M0 supplied by memory 202 are present simultaneously, which means that the content of the descriptor word at the inputs of memories 201 and 202 is equal to the content of the word read from level 1 of memories 201 and 202. The same applies to signals M1, M2 and M3. AND gate 207 indicates that a descriptor word and a memory word have been found to be identical.

The embodiment which has just been described is merely one possible embodiment of the invention and it is clear that a person skilled in the art would be capable of making modifications without exceeding the scope of the invention.

What we claim is:

1. An associative read/write memory comprising first storage means which can be read from or written into said first storage means includinng a plurality of memory units of equal capacity, each containing an equal and pretermined number of levels, addressing means connected to the said first storage means for selecting the required memory location on the selected level, and associative means connected to the said first storage means, said associative means consisting of comparators equal in number to the number of levels in each memory unit multiplied by the number of memory units for performing a comparison between the content of a data descriptor at the input to the associative memory and the content of the information read from the memory on the selected level.

2. An associative read/write memory according to claim 1, wherein each memory unit contained in the first storage means is made up of memory elements equal in number to the number of levels in the associative memory.

3. An associative read/write memory according to claim 1, wherein the second means consists of a decoder for decoding the level number in the address word present at that input of the associative memory which is shared by all the memory units.

4. An associative read/write memory according to claim 1, wherein the associative means further includes a plurality of AND gates and means for connecting the outputs of said comparators of said AND gates, said AND gates being equal in number to the number of levels in the associative memory.

5. An associative read/write memory according to claim 1, including multiplexing means for multiplexing the outputs of the memory elements in each memory unit said multiplexer having inputs equal in number to the number of levels in the associative memory.

UNITED STATES PATENT AND TRADEMARK OFFICE
CERTIFICATE OF CORRECTION

PATENT NO. : 4,128,899
DATED : December 5, 1978
INVENTOR(S) : Daniel VINOT

It is certified that error appears in the above-identified patent and that said Letters Patent are hereby corrected as shown below:

Claim 1, line 3, "includinng" should read --including--;
          line 5, "pretermined" should read --predetermined--;
Claim 4, line 4, after comparators, "of" should read --to--.

Signed and Sealed this

Thirteenth Day of November 1979

[SEAL]

Attest:

RUTH C. MASON
*Attesting Officer*

LUTRELLE F. PARKER
*Acting Commissioner of Patents and Trademarks*